United States Patent
Marcadal et al.

(10) Patent No.: US 7,691,742 B2
(45) Date of Patent: *Apr. 6, 2010

(54) ATOMIC LAYER DEPOSITION OF TANTALUM-CONTAINING MATERIALS USING THE TANTALUM PRECURSOR TAIMATA

(75) Inventors: Christophe Marcadal, Sunnyvale, CA (US); Rongjun Wang, Sunnyvale, CA (US); Hua Chung, San Jose, CA (US); Nirmalya Maity, Acton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/365,310

(22) Filed: Feb. 4, 2009

(65) Prior Publication Data

US 2009/0202710 A1 Aug. 13, 2009

Related U.S. Application Data

(63) Continuation of application No. 11/773,302, filed on Jul. 3, 2007, now Pat. No. 7,524,762, which is a continuation of application No. 11/061,039, filed on Feb. 19, 2005, now Pat. No. 7,241,686.

(60) Provisional application No. 60/589,402, filed on Jul. 20, 2004, provisional application No. 60/590,216, filed on Jul. 21, 2004.

(51) Int. Cl.
H01L 21/44 (2006.01)
H01L 21/285 (2006.01)

(52) U.S. Cl. .................. 438/656; 438/683; 438/685; 257/E21.17

(58) Field of Classification Search ............ 438/656, 438/683, 685; 257/E21.17
See application file for complete search history.

(56) References Cited

U.S. PATENT DOCUMENTS 4,389,973 A 6/1983 Suntola et al.

(Continued)

FOREIGN PATENT DOCUMENTS

EP 1167569 1/2002

(Continued)

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

(Continued)

Primary Examiner—Luan C Thai
(74) Attorney, Agent, or Firm—Patterson & Sheridan, LLP

(57) ABSTRACT

In one embodiment, a method for forming a tantalum-containing material on a substrate is provided which includes heating a liquid tantalum precursor containing tertiaryamylimido-tris(dimethylamido) tantalum (TAIMATA) to a temperature of at least 30° C. to form a tantalum precursor gas and exposing the substrate to a continuous flow of a carrier gas during an atomic layer deposition process. The method further provides exposing the substrate to the tantalum precursor gas by pulsing the tantalum precursor gas into the carrier gas and adsorbing the tantalum precursor gas on the substrate to form a tantalum precursor layer thereon. Subsequently, the tantalum precursor layer is exposed to at least one secondary element-containing gas by pulsing the secondary element-containing gas into the carrier gas while forming a tantalum barrier layer on the substrate. The tantalum barrier layer may contain tantalum, tantalum nitride, tantalum silicon nitride, tantalum boron nitride, tantalum phosphorous nitride or tantalum oxynitride.

20 Claims, 3 Drawing Sheets

U.S. PATENT DOCUMENTS

| | | |
|---|---|---|
| 4,413,022 A | 11/1983 | Suntola et al. |
| 5,916,365 A | 6/1999 | Sherman |
| 5,923,056 A | 7/1999 | Lee et al. |
| 6,015,917 A | 1/2000 | Bhandari et al. |
| 6,084,302 A | 7/2000 | Sandhu |
| 6,124,158 A | 9/2000 | Dautartas et al. |
| 6,144,060 A | 11/2000 | Park et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,270,572 B1 | 8/2001 | Kim et al. |
| 6,284,646 B1 | 9/2001 | Leem et al. |
| 6,287,965 B1 | 9/2001 | Kang et al. |
| 6,305,314 B1 | 10/2001 | Sneh et al. |
| 6,342,277 B1 | 1/2002 | Sherman |
| 6,348,376 B2 | 2/2002 | Lim et al. |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,468,924 B2 | 10/2002 | Lee et al. |
| 6,475,276 B1 | 11/2002 | Elers et al. |
| 6,475,910 B1 | 11/2002 | Sneh |
| 6,482,262 B1 | 11/2002 | Elers et al. |
| 6,482,733 B2 | 11/2002 | Raaijmakers et al. |
| 6,511,539 B1 | 1/2003 | Raaijmakers et al. |
| 6,569,501 B2 | 5/2003 | Chiang et al. |
| 6,585,823 B1 | 7/2003 | Van Wijck et al. |
| 6,593,484 B2 | 7/2003 | Yasuhara et al. |
| 6,596,602 B2 | 7/2003 | Iizuka et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,201 B2 | 10/2003 | Chiang et al. |
| 6,632,279 B1 | 10/2003 | Ritala et al. |
| 6,784,096 B2 | 8/2004 | Chen et al. |
| 6,800,173 B2 | 10/2004 | Chiang et al. |
| 6,803,272 B1 | 10/2004 | Halliyal et al. |
| 6,815,285 B2 | 11/2004 | Choi et al. |
| 6,838,125 B2 | 1/2005 | Chung et al. |
| 7,067,422 B2 * | 6/2006 | Nakamura et al. .......... 438/656 |
| 2001/0000866 A1 | 5/2001 | Sneh et al. |
| 2001/0002280 A1 | 5/2001 | Sneh |
| 2001/0009695 A1 | 7/2001 | Saanila et al. |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0007790 A1 | 1/2002 | Park |
| 2002/0009544 A1 | 1/2002 | McFeely et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0048635 A1 | 4/2002 | Kim et al. |
| 2002/0052097 A1 | 5/2002 | Park |
| 2002/0060363 A1 | 5/2002 | Xi et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0086111 A1 | 7/2002 | Byun et al. |
| 2002/0086507 A1 | 7/2002 | Park et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0106846 A1 | 8/2002 | Seutter et al. |
| 2002/0115886 A1 | 8/2002 | Yasuhara et al. |
| 2002/0117399 A1 | 8/2002 | Chen et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0013320 A1 | 1/2003 | Kim et al. |
| 2003/0017697 A1 | 1/2003 | Choi et al. |
| 2003/0031807 A1 | 2/2003 | Elers et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072975 A1 | 4/2003 | Shero et al. |
| 2003/0079686 A1 | 5/2003 | Chen et al. |
| 2003/0082296 A1 | 5/2003 | Elers et al. |
| 2003/0082301 A1 | 5/2003 | Chen et al. |
| 2003/0082307 A1 | 5/2003 | Chung et al. |
| 2003/0089308 A1 | 5/2003 | Raaijmakers |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121608 A1 | 7/2003 | Chen et al. |
| 2003/0124262 A1 | 7/2003 | Chen et al. |
| 2003/0143328 A1 | 7/2003 | Chen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0205729 A1 | 11/2003 | Basceri et al. |
| 2003/0213987 A1 | 11/2003 | Basceri et al. |
| 2003/0219942 A1 | 11/2003 | Choi et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2004/0005749 A1 | 1/2004 | Choi et al. |
| 2004/0009307 A1 | 1/2004 | Koh et al. |
| 2004/0011504 A1 | 1/2004 | Ku et al. |
| 2004/0014320 A1 | 1/2004 | Chen et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0046197 A1 | 3/2004 | Basceri et al. |
| 2004/0077183 A1 | 4/2004 | Chung |
| 2004/0187304 A1 | 9/2004 | Chen et al. |
| 2004/0219784 A1 | 11/2004 | Kang et al. |
| 2004/0224506 A1 | 11/2004 | Choi et al. |
| 2004/0235285 A1 | 11/2004 | Kang et al. |

| | | | |
|---|---|---|---|
| 2004/0256351 A1 | 12/2004 | Chung et al. | |
| 2005/0006799 A1 | 1/2005 | Gregg et al. | |
| 2005/0009325 A1 | 1/2005 | Chung et al. | |
| 2005/0059240 A1 | 3/2005 | Choi et al. | |
| 2005/0104142 A1 | 5/2005 | Narayanan et al. | |

FOREIGN PATENT DOCUMENTS

| | | |
|---|---|---|
| GB | 2355727 | 5/2001 |
| JP | 07300649 | 11/1995 |
| JP | 2001111000 | 4/2001 |
| JP | 2001172767 | 6/2001 |
| WO | WO-9929924 | 6/1999 |
| WO | WO-9965064 | 12/1999 |
| WO | WO-0016377 | 3/2000 |
| WO | WO-0054320 | 9/2000 |
| WO | WO-0115220 | 3/2001 |
| WO | WO-0117692 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0166832 | 9/2001 |
| WO | WO-0201628 | 1/2002 |
| WO | WO-0208485 | 1/2002 |
| WO | WO-0243115 | 5/2002 |
| WO | WO-0245167 | 6/2002 |
| WO | WO-0245871 | 6/2002 |
| WO | WO-0246489 | 6/2002 |

OTHER PUBLICATIONS

D. Josell et al., "Seedless Superfill: Copper Electrodeposition in Trenches with Ruthenium Barriers." Electrochemical and Solid State Letters, 6 (10), C143-C145, (2003).

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

International Search Report and Written Opinion of International Application No. PCT/US05/25486, dated Jan. 3, 2007.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.

Niinisto, et al. "Synthesis of Oxide Thin Films and Overlayers by Atomic Layer Epitaxy for Advanced Applications," Materials Science and Engineering B41 (1996) 23-29.

Notification of Second Office Action dated Nov. 21, 2008 for Chinese Patent Application No. 200580023292.X.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Ritala, M., et al., "Chemical Vapor Deposition," Jan. 1999, p. 6-9.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p. 2016-20.

Shenai, et al., "Correlation of vapor pressure equation and film properties with trimethylindium purity for the MOVPE grown III-V compounds," Journal of Crystal Growth 248 (2003) pp. 91-98.

* cited by examiner

ATOMIC LAYER DEPOSITION OF TANTALUM-CONTAINING MATERIALS USING THE TANTALUM PRECURSOR TAIMATA

CROSS-REFERENCE TO RELATED APPLICATIONS

This application is a continuation of U.S. patent application Ser. No. 11/773,302, filed Jul. 3, 2007, now issued as U.S. Pat. No. 7,524,762, which is a continuation of U.S. patent application Ser. No. 11/061,039, filed Feb. 19, 2005, and issued as U.S. Pat. No. 7,241,686, which claims benefit of both U.S. Patent Application Ser. No. 60/589,402, filed Jul. 20, 2004, and U.S. Patent Application Ser. No. 60/590,216, filed Jul. 21, 2004, which are all herein incorporated by reference in their entirety.

BACKGROUND OF THE INVENTION

1. Field of the Invention

This invention relates to electronic device processing. More particularly, this invention relates to improvements in the process of depositing tantalum-containing layers on substrates using sequential deposition techniques.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises. Formation of tantalum-containing layers, such as tantalum, tantalum nitride, and tantalum silicon nitride, in multi-level integrated circuits poses many challenges to process control, particularly with respect to contact formation.

Contacts are formed by depositing conductive interconnect material in an opening (e.g., via) on the surface of insulating material disposed between two spaced-apart conductive layers. Copper is the most popular conductive interconnect material, but suffers from diffusion into neighboring layers, such as dielectric layers. The resulting and undesirable presence of copper causes dielectric layers to become conductive and ultimate device failure. Therefore, barrier materials are used to control copper diffusion.

Barrier layers formed from sputtered tantalum and reactive sputtered tantalum nitride have demonstrated properties suitable for use to control copper diffusion. Exemplary properties include high conductivity, high thermal stability and resistance to diffusion of foreign atoms. Both physical vapor deposition (PVD) and atomic layer deposition (ALD) processes are used to deposit tantalum or tantalum nitride in features of small size (e.g., about 90 nm wide) and high aspect ratios of about 5:1. However, it is believed that PVD processes may have reached a limit at this size and aspect ratio, while ALD processes are anticipated to be used in the next generation technology of 45 nm wide features having aspect ratios of about 10:1. Also, ALD processes more easily deposit tantalum-containing films on features containing undercuts than does PVD processes.

Attempts have been made to use traditional tantalum precursors found in existing chemical vapor deposition (CVD) or ALD processes to deposit tantalum-containing films. Examples of tantalum precursors may include tantalum chloride ($TaCl_5$) and various metal-organic sources, such as pentakis(diethylamido) tantalum (PDEAT), pentakis(dimethylamido) tantalum (PDMAT), tertbutylimidotris(diethylamido) tantalum (TBTDEAT) and tertbutylimidotris(dimethylamido) tantalum (TBTDMAT). However, traditional tantalum precursors may suffer drawbacks during deposition processes. Formation of tantalum-containing films from processes using $TaCl_5$ as a precursor may require as many as three treatment cycles using various radial based chemistries (e.g., atomic hydrogen or atomic nitrogen) to form metallic tantalum or tantalum nitride. Processes using $TaCl_5$ may also suffer from chlorine contamination within the tantalum-containing layer. While metal-organic sources of tantalum produce tantalum-containing materials with no chlorine contamination, the deposited materials may suffer with the undesirable characteristic of high carbon content.

Therefore, there is a need for a process to deposit tantalum-containing materials into high aspect ration features having a high level of surface uniformity and a low concentration of contaminant.

SUMMARY OF THE INVENTION

In one embodiment, a method for forming a tantalum barrier layer on a substrate disposed in a process chamber is provided which includes heating a tantalum precursor containing tertiaryamylimido-tris(dimethylamido) tantalum (TAIMATA) to a predetermined temperature to form a tantalum-containing gas and flowing the tantalum-containing gas into the process chamber. The tantalum-containing gas is adsorbed on the substrate to form a tantalum-containing layer. The method further includes purging the process chamber with a purge gas, flowing at least one secondary element-containing gas into the process chamber, reacting the at least one secondary element-containing gas with the tantalum-containing layer to form the tantalum barrier layer and purging the process chamber with the purge gas. The TAIMATA may be heated to the predetermined temperature in a range from about 50° C. to about 80° C.

In another example, a method for forming a device by forming a tantalum-containing material on a substrate disposed in a processing chamber is provided which includes forming a tantalum-containing gas by heating a liquid TAIMATA precursor in a vaporizer with a carrier gas to a predetermined temperature. The method further includes exposing the substrate to an atomic layer deposition process comprising a pulse of a tantalum-containing gas, a pulse of the nitrogen-containing gas and a pulse of a silicon-containing gas and forming the tantalum-containing material to a predetermined thickness by repeating the atomic layer deposition process.

In another example, a method for depositing a tantalum-containing material on a substrate in a process chamber is provided which includes exposing the substrate sequentially to a pulse of a tantalum-containing gas containing TAIMATA and to a pulse of a process gas containing at least one secondary precursor to deposit a tantalum-containing film on the substrate. The exposing step is repeated until the tantalum-containing film is at a predetermined thickness and subsequently, a metal layer is deposited on the tantalum-containing film.

In another embodiment, a method for depositing a tantalum-containing gate material on a substrate in a process chamber is provide which includes exposing the substrate to an ALD process cycle that includes a pulse of a tantalum-containing gas that contains TAIMATA, a pulse of a nitrogen precursor and a pulse of a third precursor to form a tantalum-containing material. The third precursor may include a silicon precursor, a boron precursor, a phosphorous precursor or combinations thereof. The ALD process cycle is repeated until the tantalum-containing material is at a predetermined thickness.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

Embodiments of the invention include atomic layer deposition (ALD) processes to deposit a tantalum-containing material onto a substrate surface. The ALD processes include sequentially exposing the substrate surface to a tantalum precursor and at least a second compound, such as a nitrogen precursor and/or a silicon precursor. The process generally employs the tantalum precursor tertiaryamylimido-tris(dimethylamido) tantalum (TAIMATA). The deposited tantalum-containing material may include tantalum, tantalum nitride, tantalum silicon nitride, tantalum boron nitride, tantalum phosphorus nitride, or tantalum oxynitride.

Figure 1:
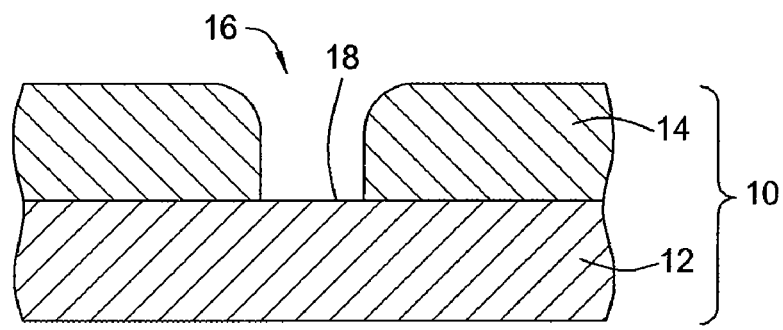
FIG. 1 is a detailed cross-sectional view of a substrate before deposition of a barrier layer in accordance with one embodiment described herein.

Referring to FIG. 1 a substrate 10 has an exemplary structure upon which a tantalum-containing layer can be deposited is shown. Substrate 10 includes a wafer 12 that may have one or more layers, shown as layer 14, disposed thereon. Wafer 12 may be formed from a material suitable for semiconductor processing, such as silicon or silicon. Layer 14 may be formed from any suitable material, including dielectric or conductive materials. Preferably, layer 14 is a dielectric material such as a silicon-containing material. Layer 14 may also include a void 16 exposing a region 18 of wafer 12.

Figure 2:
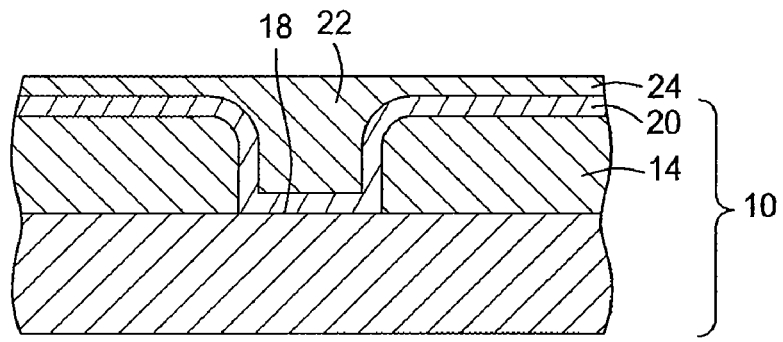
FIG. 2 is a detailed cross-sectional view of a substrate shown above in FIG. 1 after deposition of a barrier layer and a metal contact in accordance with one embodiment described herein.

Referring to FIG. 2, formed on layer 14 and within region 18 is a barrier layer 20 containing a tantalum-containing material deposited by processes described herein. In one example, barrier layer 20 is formed from tantalum nitride or tantalum silicon nitride by sequentially exposing substrate 10 to a tantalum precursor and at least a second elemental precursor, such as a nitrogen precursor and/or silicon precursor. Although not required, barrier layer 20 may contain monolayers of multiple compounds, such as tantalum nitride and tantalum metal. Tantalum nitride barrier layer 20 conforms to the profile of void 16 so as to cover region 18 and layer 14. A contact 22 is fabricated by formation of a metal layer 24 deposited on barrier layer 20, filling void 16. Metal layer 24 may be formed using standard techniques (e.g., ALD, PVD, CVD, electroless plating, electroplating, or combinations thereof) and include seed formation and/or fill. Metal layer 24 is a conductive metal that includes copper, tungsten, aluminum, tantalum, titanium, ruthenium, silver, alloys thereof, or combinations thereof. Preferably, metal layer 24 contains copper or a copper-containing alloy.

In one example, barrier layer 20 serves as a seed layer to promote the formation of metal layer 24 using, for example, electroplating or ALD techniques. Important characteristics that barrier layer 20 should demonstrate include good step coverage, thickness uniformity, high electrical conductivity and ability to prohibit copper diffusion. Barrier layer 20 is deposited employing sequential techniques, such as atomic layer deposition further described herein.

One example of forming barrier layer 20 employing sequential deposition techniques includes exposing substrate 10 to a tantalum-containing gas formed by vaporizing the liquid precursor TAIMATA. "TAIMATA" is used herein to describe tertiaryamylimido-tris(dimethylamido) tantalum with the chemical formula ($^t$AmylN)Ta(NMe$_2$)$_3$, wherein $^t$Amyl is the tertiaryamyl group (C$_5$H$_{11}$— or CH$_3$CH$_2$C(CH$_3$)$_2$—). A tantalum-containing gas may be formed by heating a liquid TAIMATA precursor in a vaporizer, a bubbler or an ampoule to a temperature of at least 30° C., preferably to a temperature in a range from about 50° C. to about 80° C. A carrier gas is flown across or bubbled through the heated TAIMATA to form a tantalum-containing gas.

Substrate 10 is placed in to a process chamber and heated to a temperature in a range from about 200° C. to about 500° C., preferably from about 250° C. to about 400° C., and more preferably from about 330° C. to about 360° C. The process chamber has a controlled environment that is pressurized in a range from about 1 mTorr to about 100 Torr, preferably from about 1 Torr to about 10 Torr, and more preferably from about 2 Torr to about 5 Torr. Substrate 10 is exposed to a process gas that includes the tantalum-containing gas and a carrier gas. Herein, the carrier gas and/or the purge gas may be Ar, He, N$_2$, H$_2$, forming gas, and combinations thereof. A tantalum-containing layer is formed on substrate 10. It is believed that the tantalum-containing layer has a surface of ligands comprising amido (—NMe$_2$) and imido (=N$^t$Amyl).

In one example, the tantalum-containing layer is exposed to another process gas that includes a nitrogen-containing gas and a carrier gas to deposit the tantalum-containing layer forming a barrier layer 20 of tantalum nitride. In this example, the nitrogen-containing gas may comprise ammonia and a carrier gas. It is believed that the amido and imido ligands in the exposed surface of the tantalum-containing layer react with the ammonia to form byproducts that include radicals (e.g., NH$_2$, NMe$_2$, N$^t$Amyl, HN$^t$Amyl, or $^t$Amyl), pentene, amines (e.g., HNMe$_2$ or H$_2$N$^t$Amyl), (Me$_2$N)$_2$, and H$_2$ among others. In this manner, a surface containing a layer of tantalum nitride is formed on substrate 10.

Barrier layer 20 is a tantalum-containing material. In a preferred embodiment, the tantalum-containing material is tantalum nitride or tantalum silicon nitride. An example of the deposition process may form tantalum nitride with the chemical formula TaN$_x$, where x is in a range from about 0.4 to about 2.0. Tantalum nitride is often derived with empirical formulas that include TaN, Ta$_3$N$_5$ Ta$_2$N or Ta$_6$N$_{2.57}$. Tantalum-containing materials are deposited as amorphous or crystalline materials. The ALD process provides stoichiometric control during the deposition of tantalum-containing materials. The stoichiometry may be altered by various procedures following the deposition process, such as when $Ta_3N_5$ is thermally annealed to form TaN. The ratio of the precursors may be altered during deposition to control the stoichiometry of the tantalum-containing materials.

In another example of the deposition process, tantalum silicon nitride may be formed with the chemical formula $TaSi_xN_y$, where x is in a range from about 0.4 to about 2.0 and y is in a range from about 0.1 to about 1.0. In other examples, the tantalum-containing compounds formed by deposition processes described herein include tantalum, tantalum phosphorous nitride, tantalum boron nitride, tantalum silicide, tantalum oxide, tantalum oxynitride, tantalum silicate, tantalum boride, tantalum phosphide, or derivatives thereof.

An important precursor characteristic is to have a favorable vapor pressure. Deposition precursors may have gas, liquid or solid states at ambient temperature and pressure. However, within the ALD chamber, precursors are volatilized as gas or plasma. Precursors are usually heated prior to delivery into the process chamber.

Although TAIMATA is the preferred tantalum-containing precursor, other tantalum precursors may be heated to form tantalum-containing gases in some embodiments. Tantalum precursors may contain ligands such as alkylamidos, alkylimidos, cyclopentadienyls, halides, alkyls, alkoxides and combinations thereof. Alkylamido tantalum compounds used as tantalum precursors include $(RR'N)_5Ta$, where R or R' are independently hydrogen, methyl, ethyl, propyl, or butyl. Alkylimido tantalum compounds used as tantalum precursors include $(RN)(R'R''N)_3Ta$, where R, R', or R'' are independently hydrogen, methyl, ethyl, propyl, butyl, or pentyl (amyl). Specific tantalum precursors may include $(^tAmylN)Ta(NMe_2)_3$, $(^tAmylN)Ta(NEt_2)_3$, $(^tAmylN)Ta(NMeEt)_3$, $(tBuN)Ta(NMe_2)_3$, $(tBuN)Ta(NEt_2)_3$, $(^tBuN)Ta(NMeEt)_3$, $(Et_2N)_5Ta$, $(Me_2N)_5Ta$, $(EtMeN)_5Ta$, $(Me_5C_5)TaCl_4$, (acac)$(EtO)_4Ta$, $Br_5Ta$, $Cl_5Ta$, $I_5Ta$, $F_5Ta$, $(NO_3)_5Ta$, $(tBuO)_5Ta$, $(^iPrO)_5Ta$, $(EtO)_5Ta$, and $(MeO)_5Ta$. Preferably, the tantalum precursor is an amylimido compound, such as $(^tAmylN)Ta(NMe_2)_3$, $(^tAmylN)Ta(NEt_2)_3$, or $(^tAmylN)Ta(NMeEt)_3$.

Nitrogen-containing compounds or nitrogen precursors may be used to deposit tantalum-containing materials, such as tantalum nitride, tantalum boron nitride, tantalum silicon nitride, tantalum phosphorous nitride or tantalum oxynitride. Nitrogen precursors include, but are not limited to, ammonia ($NH_3$), hydrazine ($N_2H_4$), methyl hydrazine (($CH_3$)$HN_2H_2$), dimethyl hydrazine (($CH_3$)$_2N_2H_2$), t-butylhydrazine ($C_4H_9N_2H_3$), phenylhydrazine ($C_6H_5N_2H_3$), other hydrazine derivatives, amines, a nitrogen plasma source (e.g., $N_2$, $N_2/H_2$, $NH_3$, or a $N_2H_4$ plasma), 2,2'-azotertbutane (($CH_3$)$_6C_2N_2$), organic or alkyl azides, such as methylazide ($CH_3N_3$), ethylazide ($C_2H_5N_3$), trimethylsilylazide ($Me_3SiN_3$), inorganic azides (e.g., $NaN_3$ or $Cp_2CoN_3$) and other suitable nitrogen sources. Radical nitrogen compounds can be produced by heat, hot-wires and/or plasma, such as $N_3$, $N_2$, N, NH, or $NH_2$. Preferably, the nitrogen precursor is ammonia or hydrazine.

Silicon-containing compounds or silicon precursors may be used to deposit tantalum-containing materials, such as tantalum silicon nitride, tantalum silicate or tantalum silicide. Silicon precursors include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X' is independently F, Cl, Br, or I, such as hexachlorodisilane ($Si_2Cl_6$), tetrachlorosilane ($SiCl_4$), dichlorosilane ($Cl_2SiH_2$), and trichlorosilane ($Cl_3SiH$). Organosilanes include compounds with the empirical formula $R_ySi_xH_{(2x+2-y)}$, where R is independently methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), and hexamethyldisilane (($CH_3$)$_6Si_2$). The preferred silicon sources include silane, disilane, and methylsilane.

Other reactive gases that may be used to deposit tantalum-containing materials include oxygen sources and reductants. A tantalum-containing material, such as tantalum silicate, tantalum oxide or tantalum oxynitride may be formed with the addition of an oxygen source to the ALD process. Oxygen sources or oxygen precursors include atomic-O, $O_2$, $O_3$, $H_2O$, $H_2O_2$, organic peroxides, derivatives thereof, and combinations thereof. Reducing compounds may be included in the ALD process to form a tantalum-containing compound, such as metallic tantalum, tantalum boron nitride or tantalum phosphorous nitride. Reducing compounds include borane ($BH_3$), diborane ($B_2H_6$), alkylboranes (e.g., $Et_3B$), phosphine ($PH_3$), hydrogen ($H_2$), derivatives thereof, and combinations thereof.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A (e.g., tantalum precursor) is pulsed into the reaction zone followed by a first time delay. Next, a second precursor or compound B (e.g., nitrogen precursor) is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, the size of the substrate, the pattern density on the substrate surface (e.g., aspect ratio) and the volatility/reactivity of the particular precursor compound itself. A "half-reaction" as used herein to refer to a precursor pulse step followed by a purge pulse step.

Embodiments of the processes described herein deposit tantalum-containing materials, such as tantalum nitride or tantalum silicon nitride, on various substrates surfaces and substrates. A "substrate surface" as used herein refers to any substrate or material surface formed on a substrate upon which film processing is performed. For example, a substrate surface on which processing may be performed include materials such as, silicon, silicon oxide, strained silicon, silicon on insulator (SOI), carbon doped silicon oxides, silicon nitride, doped silicon, germanium, gallium arsenide, glass, sapphire, and any other materials depending on the application. Carbon doped silicon oxides, such as $SiO_xC_y$, can be deposited by spin-on processes or vapor deposition processes, for example, BLACK DIAMOND® low-k dielectric, available from Applied Materials, Inc., located in Santa Clara, Calif. Substrates may have various dimensions, such as 200 mm or 300 mm diameter round wafers, as well as, rectangular, or square panes. Embodiments of the processes described herein deposit tantalum-containing materials on many substrates and surfaces, especially, silicon and silicon-containing materials. Substrates on which embodiments of the invention may be useful include, but are not limited to semiconductor wafers, such as crystalline silicon (e.g., Si<100> or Si<111>), glass, silicon oxide, strained silicon, silicon germanium, doped or undoped polysilicon, doped or undoped silicon wafers silicon nitride. Pretreatment of surfaces includes polishing, etching, reduction, oxidation, hydroxylation, annealing, and/or baking.

Figure 3:
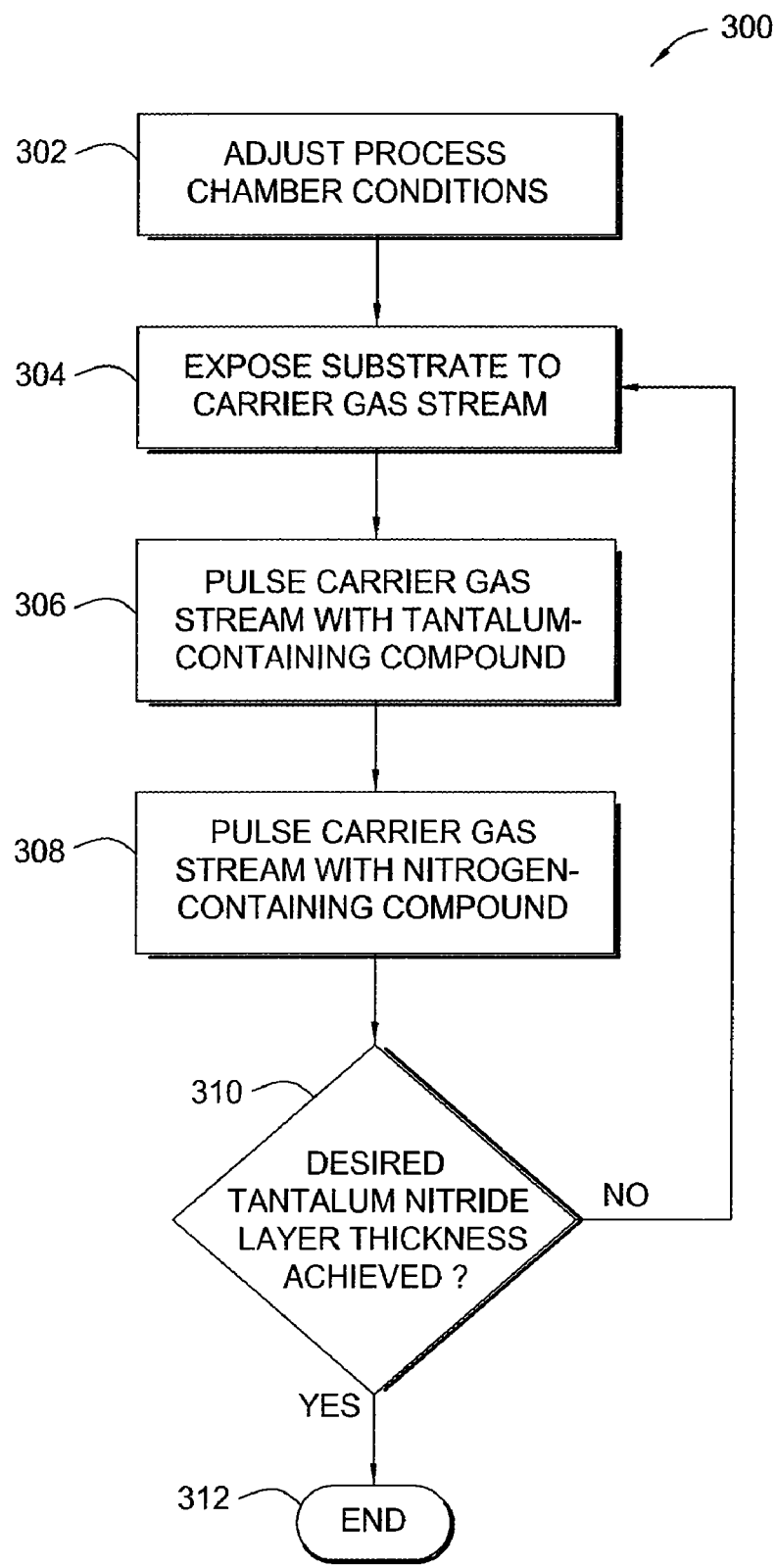
FIG. 3 is flow diagram showing a method of depositing a tantalum-containing layer in accordance with one embodiment described herein.
Figure 4:
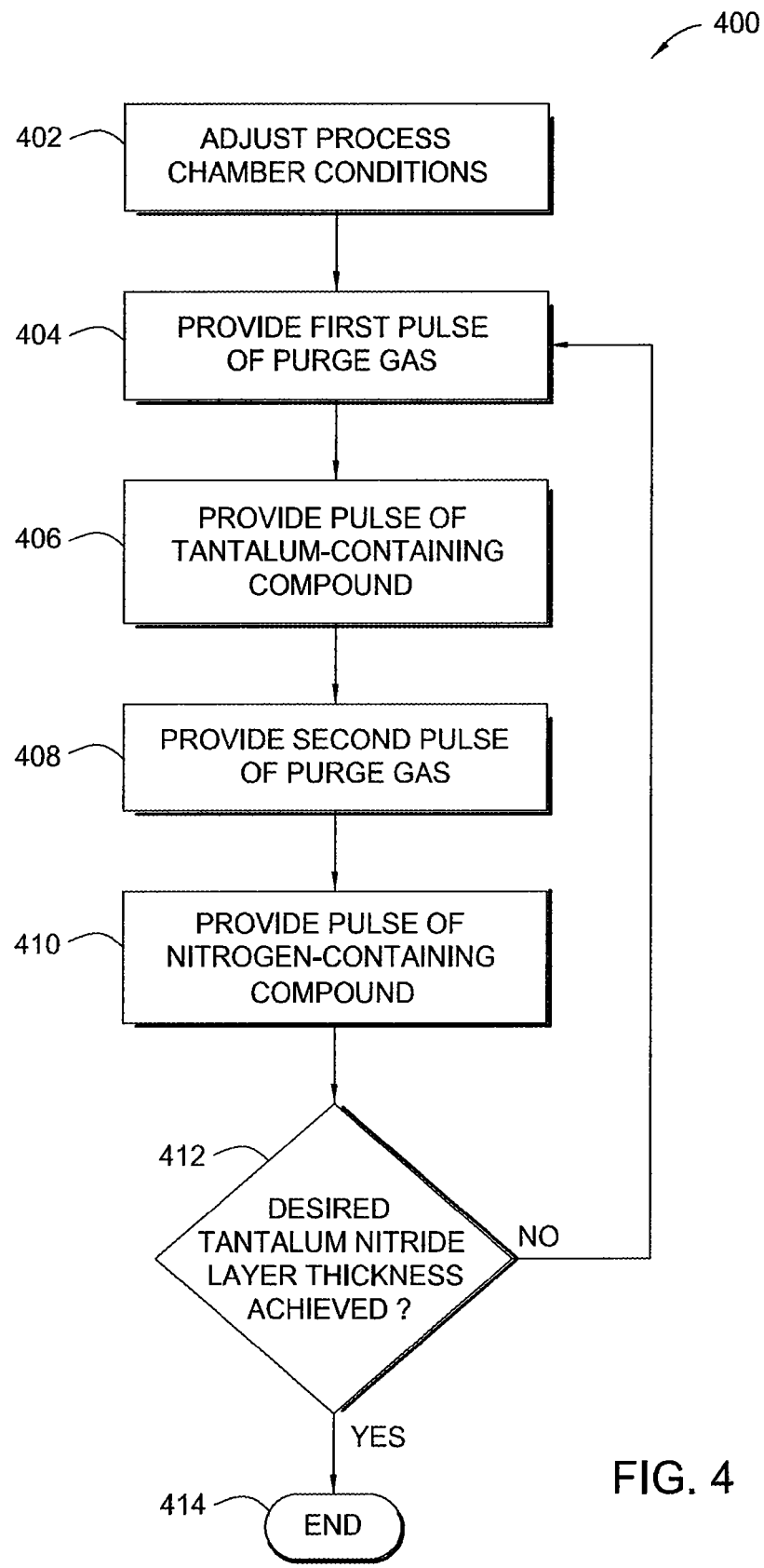
FIG. 4 is flow diagram showing a method of depositing a tantalum-containing layer in accordance with another embodiment described herein.

FIGS. 3 and 4 illustrate a process sequence for tantalum nitride formation using ALD process or similar cyclical deposition techniques. The TAIMATA precursor may be heated in a vaporizer, a bubbler or an ampoule prior to flowing into an ALD process chamber. The TAIMATA may be heated to a temperature at least 30° C., preferably in a range from about 45° C. to about 90° C., more preferably from about 50° C. to about 80° C., such as about 70° C. The preheated TAIMATA precursor is retained in the carrier gas more thoroughly than if the TAIMATA precursor was at room temperature. An exemplary substrate temperature during the deposition process is in the range from about 200° C. to about 500° C., preferably from about 250° C. to about 400° C., and more preferably from about 330° C. to about 360° C. The process chamber regional varies, but has a similar temperature to that of the substrate temperature. The process chamber has a controlled environment that is pressurized in a range from about 1 mTorr to about 100 Torr, preferably from about 1 Torr to about 10 Torr, and more preferably from about 2 Torr to about 5 Torr. In other examples, it should be understood that other temperatures and pressures may be used.

For clarity and ease of description, the method will be further described as it relates to the deposition of a tantalum nitride barrier layer using a cyclical deposition technique. Pulses of a tantalum-containing compound, such as TAIMATA may be introduced into the process chamber. The tantalum precursor may be provided with the aid of a carrier gas or purge gas, which includes, but is not limited to, helium, argon, nitrogen, hydrogen, forming gas and combinations thereof. Pulses of a nitrogen-containing compound, such as ammonia, are also introduced into the process chamber. A carrier gas may be used to deliver the nitrogen-containing compound. In one aspect, the flow of purge gas may be continuously provided by a gas sources (e.g., tank or in-house) to act as a purge gas between the pulses of the tantalum-containing compound and of the nitrogen-containing compound and to act as a carrier gas during the pulses of the tantalum-containing compound and the nitrogen-containing compound. In other aspects, a pulse of purge gas may be provided after each pulse of the tantalum-containing compound and each pulse the nitrogen-containing compound. Also, a constant purge or carrier gas may be flowing through the process chamber during each of the deposition steps or half reactions.

During process 300 in FIG. 3, a constant flow of carrier gas is administered into the process chamber. At step 302, the chamber conditions are adjusted, such as temperature and pressure. During deposition, the substrate may be maintained approximately below a thermal decomposition temperature of a selected tantalum precursor, such as TAIMATA. The tantalum nitride layer formation is described as starting a stream of carrier gas into the process chamber and across the substrate in step 304. In step 306, a pulse of tantalum precursor is administered into the process chamber. The tantalum precursor is pulsed into the stream of carrier gas. A monolayer of a tantalum-containing compound is adsorbed on the substrate. The remaining tantalum precursor may be removed by the flow of the purge gas and/or pull of a vacuum system. The carrier gas is continuously exposed to the substrate and a pulse of nitrogen-containing compound is added into the carrier gas during step 308. The nitrogen precursor, such as ammonia, reacts with the adsorbed tantalum-containing compound to form a tantalum nitride layer on the substrate. The remaining nitrogen precursor and any by-products (e.g., organic compounds) may be removed by the flow of the purge gas and/or pull of a vacuum system. At step 310, if the desired tantalum nitride layer thickness is achieved, then the deposition process is ended at step 312. However, multiple cycles of step 304-310 are generally repeated before achieving the desired tantalum nitride layer thickness. In one example, TAIMATA and ammonia are sequentially pulsed for 40 cycles to deposit a film with a thickness about 20 Å.

Alternatively for process 300, the tantalum nitride layer formation may start with the adsorption of a monolayer of a nitrogen-containing compound on the substrate followed by a monolayer of the tantalum-containing compound. Furthermore, in other example, a pump evacuation alone between pulses of reactant gases and/or purge gases may be used to prevent mixing of the reactant gases.

In one example, the substrate is maintained at an invariant temperature range from about 330° C. to about 360° C. and the pressure of the chamber is in a range from about 2 Torr to about 4 Torr. The substrate is exposed to a flow of nitrogen carrier gas at a rate in a range from about 1,000 sccm to about 3,000 sccm, preferably about 1,500 sccm. A tantalum-containing process gas is formed by flowing a carrier gas through the ampoule of preheated TAIMATA a rate from about 200 sccm to about 2,000 sccm, preferably about 500 sccm. The TAIMATA is maintained at about 70° C. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds. After the substrate is exposed to a pulse of TAIMATA, the flow of carrier gas may continue to purge for a period of time in a range from about 0.2 seconds to about 5.0 seconds, preferably from about 0.25 seconds to about 1.5 seconds, and more preferably about 1.0 second. A vacuum system removes any remaining TAIMATA during this purge step. Subsequently, a pulse of a nitrogen-containing process gas containing ammonia is administered to the substrate surface. The process gas may include the nitrogen-containing precursor in a carrier gas or may be solely the nitrogen-containing precursor. In one example, the process gas contains ammonia and nitrogen. The process gas containing ammonia is delivered a rate from about 1,000 sccm to about 3,000 sccm, preferably about 1,500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing ammonia, the flow of carrier gas may continue for a period of time in a range from about 0.2 seconds to about 5.0 seconds, preferably from about 0.25 seconds to about 1.5 seconds, and more preferably about 1.0 second. The vacuum system removes any remaining nitrogen precursor and/or any by-products formed during the reaction. The ALD cycle is repeated until a predetermined thickness of the tantalum-containing layer, such as tantalum nitride, is achieved, such as in a range from about 5 Å to about 200 Å, preferably from about 10 Å to about 30 Å, such as about 20 Å for a barrier layer.

In FIG. 4, process 400 illustrates another embodiment of a deposition process that sequentially pulses a purge gas, a tantalum precursor, the purge gas and a nitrogen precursor. In step 402, the chamber conditions are adjusted, such as temperature and pressure. During deposition, the substrate may be maintained approximately below a thermal decomposition temperature of a selected tantalum-containing compound, such as TAIMATA. A first pulse of purge gas is administered into the process chamber and across the substrate during step 404. A vacuum system removes gases from the process chamber during steps 404 and 408. During step 406, the substrate is exposed to a pulse of the tantalum-containing compound. The TAIMATA adsorbs to the substrate forming a monolayer. A second pulse of purge gas removes excess TAIMATA and any contaminates during step 408. During step 410, a nitrogen-containing compound is pulsed into the chamber and across the substrate. The nitrogen-containing compound reacts with the adsorbed TAIMATA to form a tantalum-containing material, such as tantalum nitride. At step 412, if the desired tantalum nitride layer thickness is achieved, then the deposition process is ended at step 414. However, multiple cycles of step 404-412 are generally repeated before achieving the desired tantalum nitride layer thickness. In one example, TAIMATA and ammonia are sequentially pulsed for 20 cycles to deposit a film with a thickness about 10 Å.

In one example, the substrate is maintained at an invariant temperature range from about 330° C. to about 360° C. and the pressure of the chamber is in a range from about 2 Torr to about 4 Torr. A tantalum-containing process gas is formed by flowing a nitrogen carrier gas through the ampoule of preheated TAIMATA a rate from about 200 sccm to about 2,000 sccm, preferably about 500 sccm. The TAIMATA is maintained at about 70° C. in the ampoule. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds. After the pulse of TAIMATA, a pulse of purge gas is administered into the process chamber while the vacuum system removes gas for a period of time in a range from about 0.2 seconds to about 5.0 seconds, preferably from about 0.25 seconds to about 1.5 seconds, and more preferably about 1.0 second. Subsequently, a pulse of a nitrogen-containing process gas containing ammonia is administered to the substrate surface. The process gas may include the nitrogen-containing precursor in a carrier gas or may be solely the nitrogen-containing precursor. The process gas containing ammonia is delivered at a rate from about 1,000 sccm to about 3,000 sccm, preferably about 1,500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing ammonia, a pulse of purge gas is administered into the process chamber while a vacuum system removes gas for a period of time in a range from about 0.2 seconds to about 5.0 seconds, preferably from about 0.25 seconds to about 1.5 seconds, and more preferably about 1.0 second. The ALD cycle is repeated until a predetermined thickness of the tantalum-containing layer, such as tantalum nitride, is achieved, such as in a range from about 5 Å to about 200 Å, preferably from about 10 Å to about 30 Å, such as about 20 Å.

The time duration for each pulse of tantalum-containing gas, pulse of the nitrogen-containing gas, and pulse of purge gas between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum-containing gas or the nitrogen-containing gas should be long enough for adsorption or reaction of a monolayer of the compound. In one aspect, a pulse of a tantalum-containing gas may still be in the chamber when a pulse of a nitrogen-containing gas enters. In general, the duration of the purge gas and/or pump evacuation should be long enough to prevent the pulses of the tantalum-containing gas and the nitrogen-containing gas from mixing together in the reaction zone.

In another embodiment, TAIMATA may be used as a tantalum-containing compound to form a ternary tantalum-containing material, such as tantalum silicon nitride, tantalum boron nitride, tantalum phosphorous nitride, tantalum oxynitride or tantalum silicate. A more detailed description of a process to form ternary or quaternary elemental tantalum-containing materials is described in commonly assigned U.S. Ser. No. 10/199,419, filed Jul. 18, 2002, and issued as U.S. Pat. No. 7,081,271, which is herein incorporated by reference in its entirety. Processes 300 and 400 may be modified in order to obtain ternary tantalum-containing materials. For example, a tantalum silicon nitride material may be formed if the substrate is exposed to a pulse of a silicon precursor as an additional step of the ALD cycle containing the pulses of TAIMATA and a nitrogen precursor. Similar, a tantalum oxynitride material may be formed if the substrate is exposed to a pulse of an oxygen precursor as an additional step of the ALD cycle containing the pulses of TAIMATA and a nitrogen precursor. In another example, a tantalum silicate material may be formed if the substrate is exposed to a pulse of TAIMATA, a pulse of a silicon precursor and a pulse of an oxygen precursor during the ALD cycle. In another example, a tantalum phosphorous nitride material may be formed if the substrate is exposed to a pulse of TAIMATA, a pulse of a nitrogen precursor and a pulse of a phosphorous precursor (e.g., phosphine) during the ALD cycle. In another example, a tantalum boron nitride material may be formed if the substrate is exposed to a pulse of TAIMATA, a pulse of a nitrogen precursor and a pulse of a boron precursor (e.g., diborane) during the ALD cycle.

In one example of forming a tantalum silicon nitride, the substrate is maintained at an invariant temperature range from about 330° C. to about 360° C. and the pressure of the chamber is in a range from about 2 Torr to about 4 Torr. A tantalum-containing process gas is formed by flowing a carrier gas through the ampoule of preheated TAIMATA a rate from about 200 sccm to about 2,000 sccm, preferably about 500 sccm. The TAIMATA is maintained at about 70° C. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds.

After the pulse of TAIMATA, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of a nitrogen-containing process gas containing ammonia is administered to the substrate surface. The process gas may include the nitrogen-containing precursor in a carrier gas or may be solely the nitrogen-containing precursor. The process gas containing ammonia is delivered a rate from about 1,000 sccm to about 3,000 sccm, preferably about 1,500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing ammonia, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of a silicon-containing process gas containing silane is administered to the substrate surface. The process gas may include the silicon-containing precursor in a carrier gas or may be solely the silicon-containing precursor. The process gas containing silane is delivered a rate from about 100 sccm to about 1,500 sccm, preferably about 400 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing silane, a pulse of purge gas is administered into the process chamber for a period of time in a range from about 0.2 seconds to about 5.0 seconds, preferably from about 0.25 seconds to about 1.5 seconds, and more preferably about 1.0 second. The ALD cycle is repeated until a predetermined thickness of the tantalum-containing layer, such as tantalum silicon nitride, is achieved, such as in a range from about 5 Å to about 200 Å, preferably from about 10 Å to about 50 Å, such as about 30 Å for a barrier layer. In another embodiment, such as for a gate electrode layer, the predetermined thickness may be in a range from about 40 Å to about 200 Å, such as about 120 Å.

In an example for forming a tantalum oxynitride, the substrate is maintained at an invariant temperature range from about 330° C. to about 360° C. and the pressure of the chamber is in a range from about 2 Torr to about 4 Torr. A tantalum-containing process gas is formed by flowing a carrier gas through the ampoule of preheated TAIMATA a rate from about 200 sccm to about 2,000 sccm, preferably about 500 sccm. The TAIMATA is maintained at about 70° C. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds. After the pulse of TAIMATA, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of a nitrogen-containing process gas containing ammonia is administered to the substrate surface. The process gas may include the nitrogen-containing precursor in a carrier gas or may be solely the nitrogen-containing precursor. The process gas containing ammonia is delivered a rate from about 1,000 sccm to about 3,000 sccm, preferably about 1,500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing ammonia, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of an oxygen-containing process gas containing water is administered to the substrate surface. The process gas may include the oxygen-containing precursor in a carrier gas or may be solely the oxygen-containing precursor. The process gas containing water is delivered a rate from about 100 sccm to about 1,500 sccm, preferably about 400 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing water, a pulse of purge gas is administered into the process chamber for a period of time in a range from about 0.2 seconds to about 5.0 seconds, preferably from about 0.25 seconds to about 1.5 seconds, and more preferably about 1.0 second. The ALD cycle is repeated until a predetermined thickness of the tantalum-containing layer, such as tantalum oxynitride, is achieved, such as in a range from about 5 Å to about 200 Å, preferably from about 20 Å to about 120 Å, such as about 80 Å.

In another example, a metallic tantalum layer may be formed by reducing TAIMATA with a reductant, such as hydrogen. The substrate is maintained at an invariant temperature range from about 330° C. to about 360° C. and the pressure of the chamber is in a range from about 2 Torr to about 4 Torr. A tantalum-containing process gas is formed by flowing a carrier gas through the ampoule of preheated TAIMATA a rate from about 200 sccm to about 2,000 sccm, preferably about 500 sccm. The TAIMATA is maintained at about 70° C. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds. After the pulse of TAIMATA, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of hydrogen gas is administered to the substrate surface. The hydrogen gas is delivered a rate from about 200 sccm to about 2,000 sccm, preferably about 500 sccm and is administered to the substrate surface for a period of time in a range from about 0.1 seconds to about 3.0 seconds, preferably from about 0.25 seconds to about 1.0 second, and more preferably about 0.5 seconds. After the pulse of the hydrogen gas, a pulse of purge gas is administered into the process chamber for a period of time in a range from about 0.2 seconds to about 5.0 seconds, preferably from about 0.25 seconds to about 1.5 seconds, and more preferably about 1.0 second. The ALD cycle is repeated until a predetermined thickness of the tantalum-containing layer, such as tantalum, is achieved, such as in a range from about 5 Å to about 200 Å, preferably from about 10 Å to about 30 Å, such as about 20 Å.

In an example for forming a tantalum boron nitride, the substrate is maintained at an invariant temperature range from about 330° C. to about 360° C. and the pressure of the chamber is in a range from about 2 Torr to about 4 Torr. A tantalum-containing process gas is formed by flowing a carrier gas through the ampoule of preheated TAIMATA a rate from about 200 sccm to about 2,000 sccm, preferably about 500 sccm. The TAIMATA is maintained at about 70° C. A process gas containing TAIMATA is administered to the substrate surface for a period of time in a range from about 0.1 seconds to about 3.0 seconds, preferably from about 0.25 seconds to about 1.5 seconds, and more preferably about 0.5 seconds. After the pulse of TAIMATA, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of a nitrogen-containing process gas containing ammonia is administered to the substrate surface. The process gas may include the nitrogen-containing precursor in a carrier gas or may be solely the nitrogen-containing precursor. The process gas containing ammonia is delivered a rate from about 1,000 sccm to about 3,000 sccm, preferably about 1,500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing ammonia, a pulse of purge gas is administered into the process chamber for a period of time in a range from about 0.2 seconds to about 5.0 seconds, preferably from about 0.25 seconds to about 1.5 seconds, and more preferably about 1.0 second. Subsequently, a pulse of a boron-containing process gas containing diborane is administered to the substrate surface. The process gas may include the boron-containing precursor in a carrier gas or may be solely the boron-containing precursor. The process gas containing diborane is delivered a rate from about 50 sccm to about 1,200 sccm, preferably about 500 sccm and is administered to the substrate surface for a period of time in a range from about 0.1 seconds to about 3.0 seconds, preferably from about 0.25 seconds to about 1.0 second, and more preferably about 0.5 seconds. After the pulse of the process gas containing diborane, a pulse of purge gas is administered into the process chamber for a period of time in a range from about 0.2 seconds to about 5.0 seconds, preferably from about 0.25 seconds to about 1.5 seconds, and more preferably about 1.0 second. The ALD cycle is repeated until a predetermined thickness of the tantalum-containing layer, such as tantalum boron nitride, is achieved, such as in a range from about 5 Å to about 200 Å, preferably from about 40 Å to about 150 Å, such as about 100 Å.

Figure 5:
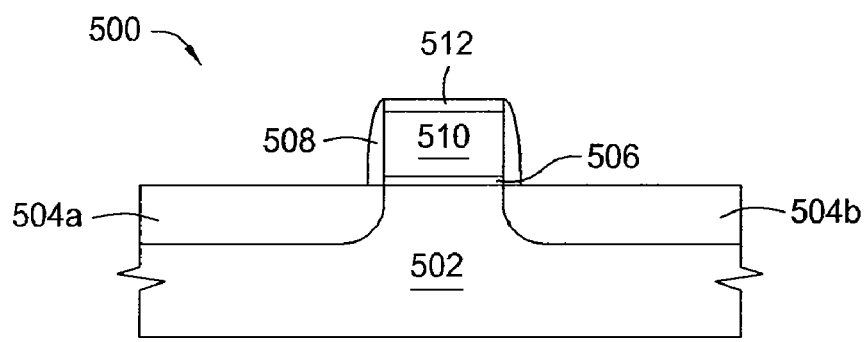
FIG. 5 is a cross-sectional view of a substrate containing a tantalum-containing gate electrode in accordance with one embodiment described herein.

In one embodiment as depicted in FIG. 5, tantalum-containing gate 510 is deposited by methods described herein as a gate electrode on substrate 500. Substrate 500 contains a source layer 504a and a drain layer 504b formed by implanting ions into substrate surface 502. The segments of source/drain layers 504 are bridged by the tantalum-containing gate 510 formed on gate insulting layer 506 (e.g., hafnium oxide or hafnium silicate). An off-set layer or spacer 508 (e.g., silicon nitride) is deposited on both sides of tantalum-containing gate 510. A metal contact layer 512 (e.g., tantalum or tungsten) is deposited on the tantalum-containing gate 510. Generally, tantalum-containing gate 510 is deposited with a thickness in a range from about 40 Å to about 200 Å. Preferably, tantalum-containing gate 510 is deposited by an ALD process described herein utilizing TAIMATA and deposited on a source/drain area of source layer 504a and drain layer 504b on substrate surface 502 to form a gate electrode. Atomic layer deposition processes utilizing TAIMATA, a nitrogen precursor and third precursor provide control of the elemental ratio of tantalum-containing gate 510.

The tantalum-containing gate 510 may have a varied composition to better control the work function between source layer 504a and drain layer 504b. Tantalum-containing gate 510 contains tantalum, nitrogen and optionally silicon, boron, phosphorus, carbon and combinations thereof. The work function of tantalum-containing gate 510 may be adjusted to be less resistive by increasing the nitrogen and/or phosphorus concentration relative to the tantalum concentration. In one example, tantalum-containing gate 510 contains tantalum nitride with a nitrogen concentration in a range from about 40 atomic percent (at %) to about 70 at %, preferably from about 50 at % to about 63 at %. In another example, tantalum-containing gate 510 contains tantalum phosphorous nitride with a phosphorus concentration in a range from about 10 at % to about 50 at %, preferably from about 20 at % to about 30 at %.

Alternatively, the work function of tantalum-containing gate 510 may be adjusted to be more resistive by increasing the carbon, silicon and/or boron concentration relative to the tantalum concentration. In one example, tantalum-containing gate 510 contains tantalum silicon nitride with a silicon concentration in a range from about 10 at % to about 20 at %. In another example, tantalum-containing gate 510 contains tantalum boron nitride with a boron concentration in a range from about 20 at % to about 60 at %, preferably from about 30 at % to about 50 at %.

A detailed description for a process chamber, such as an ALD chamber, is described in commonly assigned U.S. Ser. No. 10/032,284, filed Dec. 21, 2001, and issued as U.S. Pat. No. 6,916,398, and U.S. Ser. No. 10/281,079, filed Oct. 25, 2002, and published as U.S. Pub. No. 2003-0121608, which are herein incorporated by reference in their entirety. In one embodiment, a plasma-enhanced atomic layer deposition (PE-ALD) process is used to deposit tantalum-containing materials, such as TAIMATA. A chamber and process to perform PE-ALD is further described in commonly assigned U.S. Ser. No. 10/197,940, filed Jul. 16, 2002, and issued as U.S. Pat. No. 6,998,014, which is herein incorporated by reference in its entirety. A detailed description for a vaporizer or an ampoule to pre-heat precursors, such as TAIMATA, is described in commonly assigned U.S. Ser. No. 10/198,727, filed Jul. 17, 2002, and issued as U.S. Pat. No. 7,186,385, and U.S. Ser. No. 10/208,305, filed Jul. 29, 2002, and issued as U.S. Pat. No. 6,915,592, which are herein incorporated by reference in their entirety. A detailed description for a system to deliver the precursors, such as TAIMATA, to process chamber is described in commonly assigned U.S. Ser. No. 10/197,683, filed Jul. 17, 2002, and issued as U.S. Pat. No. 6,955,211, and U.S. Ser. No. 10/700,328, filed Nov. 3, 2003, and published as U.S. Pub. No. 2005-0095859, which are herein incorporated by reference in their entirety.

EXAMPLES

The following hypothetical Examples 1-6 demonstrate some interconnect application by deposition processes for tantalum-containing materials, such as tantalum nitride or tantalum silicon nitride described herein.

Example 1

A tantalum-containing material is deposited on a substrate surface containing a dielectric material by an ALD process using TAIMATA as described herein to a thickness in a range from about 5 Å to about 30 Å, preferably about 20 Å. Copper metal is deposited on the tantalum-containing material, such as by a PVD process to a thickness in a range from about 200

Å to about 1,500 Å, preferably about 500 Å. Subsequently, the copper layer may be exposed to an electrochemical polishing (ECP) process.

Example 2

A tantalum-containing material is deposited on a substrate surface containing a dielectric material by an ALD process using TAIMATA as described herein to a thickness in a range from about 5 Å to about 50 Å, preferably about 20 Å. Tantalum metal is deposited on the tantalum-containing material by a PVD process or by an ALD process using TAIMATA described herein to a thickness in a range from about 5 Å to about 75 Å, preferably about 25 Å. The substrate is exposed to a plasma etch process to remove materials from the bottom of the via to a depth in a range from about 5 Å to about 100 Å, preferably about 50 Å. Next, a tantalum metal is deposited by a PVD process or by an ALD process using TAIMATA described herein to a thickness in a range from about 5 Å to about 75 Å, preferably about 25 Å. Copper metal is then deposited on the tantalum metal, such as by a PVD process to a thickness in a range from about 200 Å to about 1,500 Å, preferably about 500 Å. Subsequently, the copper layer may be exposed to an ECP process.

Example 3

A tantalum-containing material is deposited on a substrate surface containing a dielectric material by an ALD process using TAIMATA as described herein to a thickness in a range from about 5 Å to about 50 Å, preferably about 20 Å. The substrate is exposed to a plasma etch process to remove materials from the bottom of the via to a depth in a range from about 5 Å to about 75 Å, preferably about 20 Å. Next, a tantalum metal is deposited by a PVD process or by an ALD process using TAIMATA as described herein to a thickness in a range from about 5 Å to about 75 Å, preferably about 25 Å. Copper metal is then deposited on the tantalum metal, such as by a PVD process to a thickness in a range from about 200 Å to about 1,500 Å, preferably about 500 Å. Subsequently, the copper layer may be exposed to an ECP process.

Example 4

A tantalum-containing material is deposited on a substrate surface containing a dielectric material by an ALD process using TAIMATA as described herein to a thickness in a range from about 5 Å to about 50 Å, preferably about 20 Å. Ruthenium metal is deposited on the tantalum-containing material by an ALD process to a thickness in a range from about 5 Å to about 75 Å, preferably about 25 Å. The substrate is exposed to a plasma etch process to remove materials from the bottom of the via to a depth in a range from about 5 Å to about 100 Å, preferably about 50 Å. Next, a ruthenium metal is deposited by an ALD process to a thickness in a range from about 5 Å to about 75 Å, preferably about 25 Å. Copper metal is then deposited on the ruthenium metal, such as by a PVD process to a thickness in a range from about 200 Å to about 1,500 Å, preferably about 500 Å. Subsequently, the copper layer may be exposed to an ECP process.

Example 5

A tantalum-containing material is deposited on a substrate surface containing a dielectric material by an ALD process using TAIMATA as described herein to a thickness in a range from about 5 Å to about 50 Å, preferably about 20 Å. Ruthenium metal is deposited on the tantalum-containing material by an ALD process to a thickness in a range from about 5 Å to about 75 Å, preferably about 40 Å. The substrate is exposed to a plasma etch process to remove materials from the bottom of the via to a depth in a range from about 5 Å to about 100 Å, preferably about 50 Å. Next, a ruthenium metal is deposited by an ALD process to a thickness in a range from about 5 Å to about 75 Å, preferably about 40 Å. Copper metal is then deposited on the ruthenium metal, such as by a PVD process to a thickness in a range from about 200 Å to about 1,500 Å, preferably about 500 Å. Subsequently, the copper layer may be exposed to an ECP process.

Example 6

A tantalum-containing material is deposited on a substrate surface containing a dielectric material by an ALD process using TAIMATA as described herein to a thickness in a range from about 5 Å to about 50 Å, preferably about 20 Å. Ruthenium metal is deposited on the tantalum-containing material by an ALD process to a thickness in a range from about 5 Å to about 75 Å, preferably about 40 Å. Copper metal is then deposited on the substrate, such as by a PVD process to a thickness in a range from about 200 Å to about 1,500 Å, preferably about 500 Å. Subsequently, the copper layer may be exposed to an ECP process.

In other examples, metal gate applications for tantalum-containing materials may be deposited by ALD processes described herein. The ALD processes preferably utilize TAIMATA as a tantalum-containing precursor. The gate layer may contain a gate material such as silicon oxynitride, hafnium oxide, aluminum oxide or combinations thereof. A tantalum nitride or a tantalum silicon nitride layer is deposited on the gate layer by an atomic layer deposition process described herein. Generally, the tantalum-containing material is deposited on a gate layer with a thickness within a range from about 20 Å to about 200 Å, preferably, about 40 Å. Subsequently, a metal-containing layer is deposited on the tantalum-containing layer. Metal-containing layers may contain titanium, titanium nitride, tungsten, tantalum, ruthenium or combinations thereof and are deposited by CVD, ALD, PVD, electroplating, or electroless plating processes. In one example, the metal-containing layer is titanium nitride deposited by a CVD process, an ALD process or a PVD process. In another example, the metal-containing layer is tungsten deposited by a CVD process. In another example, the metal-containing layer is tantalum deposited by a PVD process or an ALD process using TAIMATA as described herein. In another example, the metal-containing layer is ruthenium deposited by an ALD process.

Although the invention has been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the nitrogen-containing gas before the tantalum-containing gas is introduced into the processing chamber. In addition, the tantalum nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the invention, other and further embodiments of the invention may be devised without departing from the basic scope thereof, and the scope thereof is determined by the claims that follow.

The invention claimed is:

1. A method for forming a device, comprising:
   depositing a tantalum-containing film on a substrate within a process chamber by an atomic layer deposition process, wherein the depositing the tantalum-containing film comprises:
   exposing the substrate sequentially to a pulse of a tantalum-containing gas comprising TAIMATA and to a pulse of a process gas comprising at least one secondary precursor; and
   repeating the exposing the substrate sequentially to a pulse of the tantalum-containing gas and to a pulse of the process gas comprising at least one secondary precursor until the tantalum-containing film has a predetermined thickness;
   depositing a metal-containing material on the tantalum-containing film during a vapor deposition process; and
   depositing a copper-containing material on the metal-containing material during another deposition process.

2. A method for processing a substrate, comprising:
   heating a tantalum precursor comprising TAIMATA to a predetermined temperature to form a tantalum-containing gas;
   flowing the tantalum-containing gas into a process chamber;
   adsorbing the tantalum-containing gas on a substrate within the process chamber to form a tantalum-containing precursor layer on the substrate;
   purging the process chamber with a purge gas;
   flowing at least one secondary element-containing gas into the process chamber and reacting the at least one secondary element-containing gas with the tantalum-containing precursor layer to form the tantalum containing film on the substrate;
   purging the process chamber with the purge gas; and
   depositing a metal containing layer on the tantalum containing film during a vapor deposition process.

3. The method of claim 1, wherein the exposing a substrate sequentially to a pulse of a tantalum-containing gas comprising TAIMATA and to a pulse of a process gas comprising at least one secondary precursor comprises sequentially:
   pulsing the tantalum-containing gas with the carrier gas;
   flowing the carrier gas to the process chamber without processing gas;
   pulsing the second precursor with the carrier gas; and
   flowing a carrier gas to the process chamber without processing gas.

4. The method of claim 3, further comprising heating a liquid TAIMATA precursor to a predetermined temperature to form the tantalum-containing gas.

5. The method of claim 4, wherein the predetermined temperature is within the range from about 50° C. to about 80° C.

6. The method of claim 4, wherein the predetermined thickness of the tantalum-containing film is between about 5 Å to about 50 Å.

7. The method of claim 6, wherein the depositing a metal containing material on the tantalum-containing film comprises depositing a tantalum metal by a physical vapor deposition process or an atomic layer deposition process using TAIMATA.

8. The method of claim 6, further comprising exposing the substrate to a plasma etch process to remove materials from a bottom of a via structure on the substrate after depositing the tantalum-containing film.

9. The method of claim 8, further comprising depositing a metal layer on the tantalum-containing film before the exposing the substrate to the plasma etch process.

10. The method of claim 6, wherein the depositing a metal containing material on the tantalum-containing film comprises depositing a ruthenium metal by an atomic layer deposition process.

11. The method of claim 2, wherein the predetermined temperature is within the range from about 50° C. to about 80° C.

12. The method of claim 2, further comprising repeating the flowing the tantalum-containing gas, the purging, the flowing at least one secondary element-containing gas, and the purging until the tantalum-containing film is formed to a predetermined thickness.

13. The method of claim 12, wherein the predetermined thickness of the tantalum-containing film is between about 5 Å to about 50 Å.

14. The method of claim 13, further comprising exposing the substrate to a plasma etch process.

15. The method of claim 14, wherein exposing the substrate to the plasma etch process comprises removing material from a bottom of a via structure on the substrate to a depth in a range from about 5 Å to about 75 Å.

16. The method of claim 14, wherein the exposing the substrate to the plasma etch process is performed before or after depositing the metal containing layer on the tantalum containing material.

17. The method of claim 12, wherein the tantalum containing film is formed on a gate layer containing a gate material selected from the group consisting of silicon oxynitride, hafnium oxide, aluminum oxide, or combinations thereof.

18. The method of claim 17, wherein the predetermined thickness of the tantalum containing film is between about 20 Å to about 200 Å.

19. The method of claim 18, wherein the metal containing layer comprises a material selected from the group consisting of titanium, titanium nitride, tungsten, tantalum, ruthenium, or combinations thereof.

20. The method of claim 13, wherein the metal containing layer comprises a metal selected from the group consisting of copper, tungsten, aluminum, tantalum, titanium, ruthenium alloys thereof, and combinations thereof.

* * * * *